United States Patent

Hoshi et al.

(10) Patent No.: US 7,598,151 B2
(45) Date of Patent: *Oct. 6, 2009

(54) SEMICONDUCTOR DEVICE FABRICATION METHOD

(75) Inventors: Takeshi Hoshi, Yokohama (JP); Masahiro Kiyotoshi, Sagamihara (JP)

(73) Assignee: Kabushki Kaisha Toshiba, Tokyo (JP)

( * ) Notice: Subject to any disclaimer, the term of this patent is extended or adjusted under 35 U.S.C. 154(b) by 140 days.

This patent is subject to a terminal disclaimer.

(21) Appl. No.: 11/798,956

(22) Filed: May 18, 2007

(65) Prior Publication Data

US 2007/0224749 A1 Sep. 27, 2007

Related U.S. Application Data

(63) Continuation of application No. 11/167,233, filed on Jun. 28, 2005, now Pat. No. 7,238,587.

(30) Foreign Application Priority Data

Feb. 9, 2005 (JP) .............................. 2005-033351

(51) Int. Cl.
*H01L 21/76* (2006.01)

(52) U.S. Cl. .............................. 438/424; 257/E21.546

(58) Field of Classification Search ................ 438/404, 438/424–432, 570, 581–583; 257/E21.545, 257/E21.546, E21.548, E21.553

See application file for complete search history.

(56) References Cited

U.S. PATENT DOCUMENTS

| | | | |
|---|---|---|---|
| 4,952,524 A | 8/1990 | Lee et al. | |
| 6,191,002 B1 | 2/2001 | Koyanagi | |
| 6,372,569 B1 * | 4/2002 | Lee et al. | 438/229 |
| 6,566,229 B2 | 5/2003 | Hong et al. | |
| 6,767,641 B1 | 7/2004 | Shimizu et al. | |
| 6,919,636 B1 | 7/2005 | Ryan | |
| 7,071,107 B2 | 7/2006 | Hieda et al. | |
| 7,074,690 B1 | 7/2006 | Gauri et al. | |
| 7,238,587 B2 * | 7/2007 | Hoshi et al. | 438/424 |
| 2004/0022528 A1 | 2/2004 | Yoo et al. | |

(Continued)

FOREIGN PATENT DOCUMENTS

JP 11-307626 11/1999

(Continued)

OTHER PUBLICATIONS

Notification of Examination Opinions issued by the Taiwanese Patent Office on Jun. 20, 2008, for Taiwanese Patent Application No. 095104377, and English-language translation thereof.

*Primary Examiner*—Brook Kebede
(74) *Attorney, Agent, or Firm*—Finnegan, Henderson, Farabow, Garrett & Dunner, L.L.P.

(57) ABSTRACT

According to the present invention, there is provided a semiconductor device fabrication method having:

coating a semiconductor substrate with a silazane perhydride polymer solution prepared by dispersing a silazane perhydride polymer in a solvent containing carbon, thereby forming a coating film;

forming a polysilazane film by volatilizing the solvent by heat-treating the coating film; and inserting the semiconductor substrate into a predetermined furnace, lowering a pressure in the furnace, and oxidizing the polysilazane film while the pressure in the furnace is raised by supplying steam into the furnace, thereby forming a silicon oxide film.

10 Claims, 6 Drawing Sheets

U.S. PATENT DOCUMENTS

| | | |
|---|---|---|
| 2004/0072429 A1 | 4/2004 | Hieda et al. |
| 2004/0248374 A1 | 12/2004 | Belyansky et al. |
| 2005/0026443 A1 * | 2/2005 | Goo et al. ............... 438/694 |

FOREIGN PATENT DOCUMENTS

| | | |
|---|---|---|
| JP | 2000-58646 | 2/2000 |
| JP | 2002-367980 | 12/2002 |
| JP | 2004-179614 | 6/2004 |
| JP | 2004-343087 | 12/2004 |
| TW | 531833 | 5/2003 |

* cited by examiner

|  | FILM THICKNESS OF OXIDE FILM [nm] | CARBON CONCENTRATION [/cm³] | VARIATION IN FILM THICKNESS OF OXIDE FILM [%] |
|---|---|---|---|
| THIS EMBODIMENT | 1.30 | $2 \times 10^{19}$ | 3 |
| COMPARATIVE EXAMPLE | 1.30 | $8 \times 10^{19}$ | 8 |

SEMICONDUCTOR DEVICE FABRICATION METHOD

CROSS REFERENCE TO RELATED APPLICATION

This is a continuation of application Ser. No. 11/167,233, filed Jun. 28, 2005, now U.S. Pat. No. 7,238,587, which is incorporated herein by reference.

This application is based upon and claims benefit of priority under 35 USC §119 from the Japanese Patent Application No. 2005-33351, filed on Feb. 9, 2005, the entire contents of which are incorporated herein by reference.

BACKGROUND OF THE INVENTION

The present invention relates to a semiconductor device fabrication method.

Recently, to increase the degree of integration and the operating speed and reduce the power consumption and the fabrication cost, micropatterning of LSIs has advanced so that the minimum processing dimension (e.g., the gate length of a transistor) is nearly 0.1 µm. This LSI micropatterning is expected to advance in the future until the minimum processing dimension becomes 0.1 µm or less. For example, logic devices in which the gate length of a transistor is decreased to about 30 nm are developed.

To micropattern an element such as a transistor, it is important to micropattern an element isolation region which occupies more than half the element area. Recently, an STI (Shallow Trench Isolation) method is used as a method of forming this element isolation region. In this STI method, an element isolation trench is formed by etching the surface portion of a semiconductor substrate, and an element isolation region (i.e., an element isolation insulating film) is formed by burying an insulating film in this element isolation trench. By the use of this STI method, the width of an element isolation region reaches about 70 to 90 nm smaller than 0.1 µm.

Also, in a memory requiring a high degree of integration, the widths of both an element formation region (active area) in which a transistor and the like are formed and an element isolation region reach about 70 to 90 nm smaller than 0.1 µm. In a memory like this, micropatterning of an element isolation region is important.

On the other hand, micropatterning of elements makes the formation of an element isolation region difficult. Separation between adjacent elements is determined by the effective distance between the adjacent elements, i.e., the shortest distance (the depth of an element isolation trench×2+the width of the element isolation trench) when a circuit is made around an element isolation region.

Even when a device is micropatterned, therefore, the effective distance, i.e., the depth of an element isolation trench must be maintained in order not to deteriorate the insulation properties of adjacent elements. Since, however, the width of an element isolation trench is decreased by micropatterning, the aspect ratio (the depth of the element isolation trench/the width of the element isolation trench) of the element isolation trench increases as micropatterning advances. This makes it difficult to bury an insulating film in the element isolation trench.

As a method of burying an insulating film in an element isolation trench like this, high-density plasma (HDP) CVD is used. When a silicon oxide film as an insulating film is to be buried in an element isolation trench by using this high-density plasma CVD, the aspect ratio is 3 or more if the minimum processing dimension is 0.1 µm or less. This results in the inconvenience that voids (unfilled portions) readily form in the insulating film buried in the element isolation trench.

As a method of burying an insulating film in a micropatterned element isolation trench, therefore, it is possible to form and bury an SOG (Spin On Glass) film by spin coating (by which a semiconductor substrate is coated with a predetermined solution while being rotated).

It is also possible to form and bury a silicon oxide film by reacting TEOS (Tetraethoxysilane) gas having fluidity with $O_3$ (ozone) gas.

In still another method, a silicon oxide film is buried in an element isolation trench by using high-density plasma CVD, and a silicon oxide film formed by reacting TEOS gas with $O_3$ (ozone) gas is buried in portions not filled by high-density plasma CVD.

Recently, a semiconductor substrate is coated with a silazane perhydride polymer solution so as to fill an element isolation trench formed in the substrate, and oxidation is performed in a steam ambient to form a silicon oxide film as an element isolation insulating film (e.g., references 1 and 2).

More specifically, a silazane perhydride polymer solution is prepared by dispersing a silazane perhydride polymer $((SiH_2NH)_n)$ in a solvent such as xylene $(C_6H_4(CH_3)_2)$ or dibutylether $((C_4H_9)_{2O})$.

Then, the surface of a semiconductor substrate is coated with this silazane perhydride polymer solution by spin coating so as to fill an element isolation trench formed in the substrate. A predetermined heat treatment is performed on this coated silazane perhydride polymer solution to volatilize the solvent in it, thereby forming a polysilazane film. After that, the polysilazane film is oxidized to form a silicon oxide $(SiO_2)$ film as an element isolation insulating film.

In the polysilazane film formed by volatilizing the solvent in the silazane perhydride polymer solution, carbon (C) contained in the solvent such as xylene $(C_6H_4(CH_3)_2)$ or dibutylether $((C_4H_9)_{2O})$ remains as an impurity.

Accordingly, to form a silicon oxide $(SiO_2)$ film having high film quality, it is necessary to remove carbon (C) as an impurity by increasing the oxidation amount in the oxidation process. However, if the oxidation amount is increased while a silicon oxide film serving as a gate insulating film and a polysilicon film serving as a gate electrode are formed in an element formation region (active area), these silicon oxide film and polysilicon film oxidize. As a consequence, the electrical characteristics and reliability of the transistor deteriorate.

On the other hand, if the oxidation amount is decreased to suppress oxidation in this element formation region, an impurity such as carbon (C) remains in the silicon oxide $(SiO_2)$ film and functions as positive fixed electric charge. Consequently, the electrical characteristics and reliability of the transistor deteriorate in this case as well.

References related to the element isolation insulating film formation method are as follows.

Reference 1: Japanese Patent Laid-Open No. 2004-179614

Reference 2: Japanese Patent Laid-Open No. 2002-367980

It is an object of the present invention to provide a semiconductor device fabrication method capable of suppressing deterioration of the electrical characteristics and reliability of a transistor.

SUMMARY OF THE INVENTION

According to one aspect of the invention, there is provided a semiconductor device fabrication method comprising:

coating a semiconductor substrate with a silazane perhydride polymer solution prepared by dispersing a silazane perhydride polymer in a solvent containing carbon, thereby forming a coating film;

forming a polysilazane film by volatilizing the solvent by heat-treating the coating film; and inserting the semiconductor substrate into a predetermined furnace, lowering a pressure in the furnace, and oxidizing the polysilazane film while the pressure in the furnace is raised by supplying steam into the furnace, thereby forming a silicon oxide film.

According to one aspect of the invention, there is provided a semiconductor device fabrication method comprising:

coating a semiconductor substrate with a predetermined solution prepared by dispersing a material containing silicon in a solvent containing carbon, thereby forming a first film;

forming a second film by volatilizing the solvent by heat-treating the first film; and inserting the semiconductor substrate into a predetermined furnace, lowering a pressure in the furnace, and oxidizing the second film while the pressure in the furnace is raised by supplying steam into the furnace, thereby forming a silicon oxide film.

DETAILED DESCRIPTION OF THE INVENTION

Embodiments of the present invention will be described below with reference to the accompanying drawings.

(1) FIRST EMBODIMENT

Figure 1:
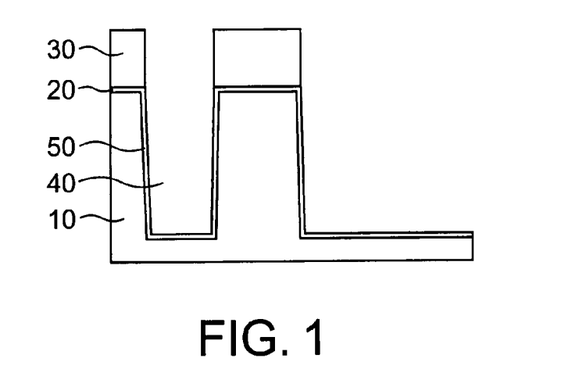
FIG. 1 is a longitudinal sectional view showing an element sectional structure in a predetermined step of a semiconductor device fabrication method according to the first embodiment of the present invention.
Figure 2:
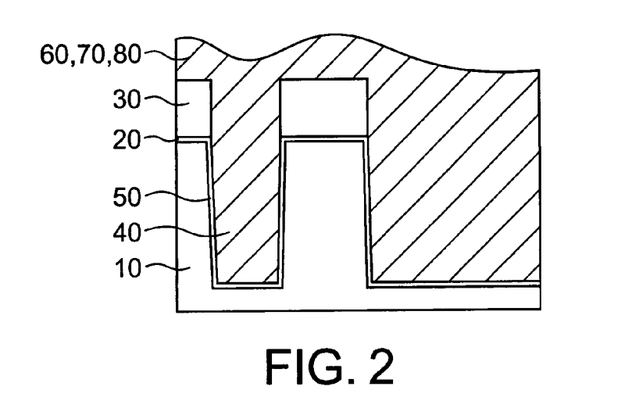
FIG. 2 is a longitudinal sectional view showing an element sectional structure in a predetermined step of the same semiconductor device fabrication method.
Figure 3:
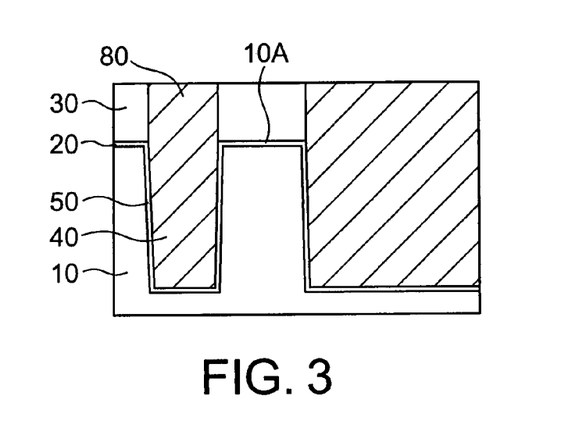
FIG. 3 is a longitudinal sectional view showing an element sectional structure in a predetermined step of the same semiconductor device fabrication method.

FIGS. 1 to 3 show an element isolation insulating film formation method according to the first embodiment of the present invention. As shown in FIG. 1, a silicon oxide ($SiO_2$) film 20 about 5 nm thick is formed on a semiconductor substrate 10 by thermal oxidation, and a silicon nitride (SiN) film 30 about 150 nm thick which serves as a stopper of polishing by CMP to be performed later is formed by CVD.

A silicon oxide ($SiO_2$) film (not shown) is formed on the entire surface of the silicon nitride (SiN) film 30 by CVD. This silicon oxide ($SiO_2$) film is coated with a photoresist (not shown), and exposure and development are performed to form a resist mask (not shown).

This resist mask is used as a mask to pattern the silicon oxide ($SiO_2$) film by RIE, thereby forming a hard mask. After that, the resist mask is removed by an asher (an apparatus which removes a resist in a vapor phase), and etching using a solution mixture of sulfuric acid and aqueous hydrogen peroxide.

This hard mask is used as a mask to sequentially pattern the silicon nitride (SiN) film 30 and silicon oxide ($SiO_2$) film 20 by RIE. The hard mask is used as a mask again to etch the semiconductor substrate 10, thereby forming an element isolation trench 40 about 300 nm deep from the surface of the semiconductor substrate 10.

After the hard mask is removed by hydrofluoric acid steam (steam containing hydrofluoric acid), a silicon oxide ($SiO_2$) film 50 about 4 nm thick is formed on the inner surfaces of the element isolation trench 40 by thermal oxidation.

Subsequently, a silazane perhydride polymer solution is prepared by dispersing a silazane perhydride polymer (($SiH_2NH)_n$) in a solvent such as xylene ($C_6H_4(CH_3)_2$) or dibutylether (($C_4H_9)_{2O}$).

As shown in FIG. 2, while the semiconductor substrate 10 is rotated, the surface of the semiconductor substrate 10 is coated with the silazane perhydride polymer solution by spin coating so as to fill the element isolation trench 40 formed in the surface portion of the semiconductor substrate 10, thereby forming a coating film 60.

As described above, the surface is coated with the silazane perhydride polymer solution as a liquid. Even when the aspect ratio of the element isolation trench 40 is high, therefore, neither voids (unfilled portions) nor seams (seamed unfilled portions) are formed inside the element isolation trench, unlike when a film is buried by using high-density plasma CVD.

Examples of the spin coating conditions are that the rotational speed of the semiconductor substrate 10 is 4,000 rpm, the rotation time is 30 sec, the dropping amount of the silazane perhydride polymer solution is 8 cc, and the target film thickness of the coating film 60 is about 500 nm.

The semiconductor substrate 10 having the coating film 60 is placed on a hotplate, and a heat treatment is performed such that the coating film 60 is baked (heated) for 3 min in an inert gas ambient at a temperature of 180° C.

Consequently, the solvent such as xylene ($C_6H_4(CH_3)_2$) or dibutylether (($C_4H_9)_{2O}$) in the silazane perhydride polymer solution is volatilized to form a polysilazane film 70. In the polysilazane film 70, a few % to ten-odd % of carbon (C) or hydrocarbon contained in the solvent remains as an impurity.

The semiconductor substrate 10 having the polysilazane film 70 is inserted into a batch type diffusion furnace (not shown). In this diffusion furnace, the polysilazane film 70 is oxidized to form a silicon oxide ($SiO_2$) film 80 serving as an element isolation insulating film.

Figure 4:
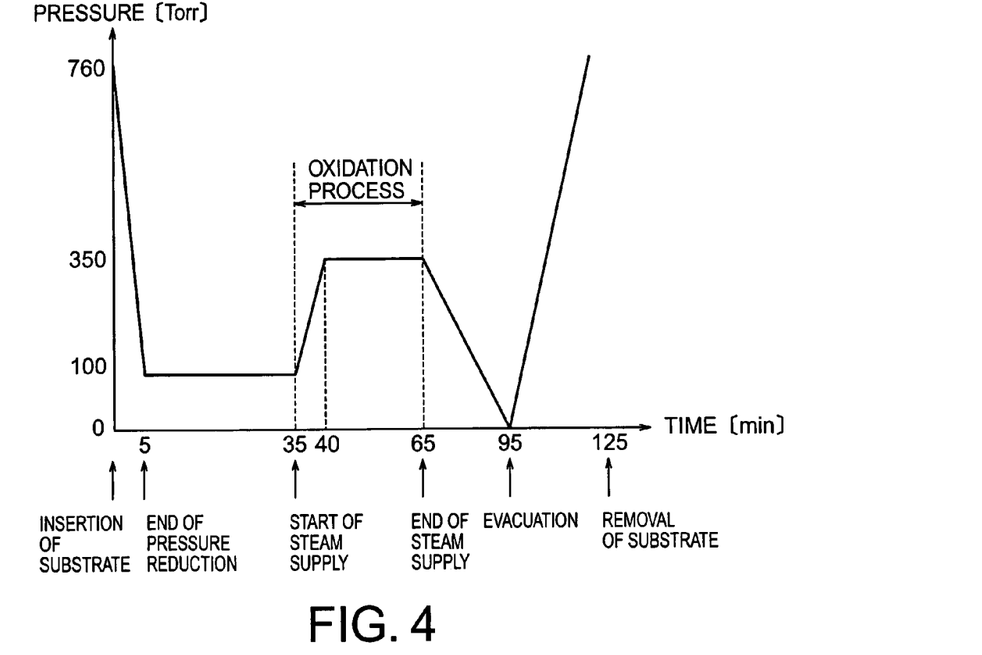
FIG. 4 is a graph showing a change in pressure in a diffusion furnace when an oxidation process of the embodiment is performed.

FIG. 4 shows a change in pressure in the diffusion furnace from the timing when the semiconductor substrate 10 is inserted into the diffusion furnace to the timing when the semiconductor substrate 10 is removed from the diffusion furnace after oxidation is performed.

As shown in FIG. 4, the semiconductor substrate 10 is inserted into the diffusion furnace after the pressure in the diffusion furnace is set at 760 Torr (atmospheric pressure) and the temperature is set at about 200° C. After that, the pressure in the diffusion furnace is lowered to 100 Torr. In this case, the pressure in the diffusion furnace need only be 100 Torr or less.

Subsequently, the temperature in the diffusion furnace is raised to, e.g., 200° C. to 500° C., and steam is supplied into the diffusion furnace when 35 min have elapsed from the insertion of the semiconductor substrate 10. While the pressure in the diffusion furnace is raised to 350 Torr over 5 min, the polysilazane film 70 is oxidized.

In this case, the pressure in the diffusion furnace need only be raised so as to fall within the range of 200 to 700 Torr. Also, although the pressure raising rate at which the pressure in the diffusion furnace is raised is set at 50 Torr/min, the pressure raising rate need only fall within the range of 50 to 100 Torr/min by adjusting the exhausting rate of a dry pump (not shown). In addition, the temperature in the diffusion furnace when oxidation is performed need only be 200° C. to 800° C.

Furthermore, control for raising the pressure in the diffusion furnace may also be performed by a pressure controller (not shown) of the diffusion furnace. It is also possible to prepare multiple pressure steps and raise the pressure in the diffusion furnace stepwise.

While the pressure in the diffusion furnace is held at 350 Torr, oxidation is further performed in the steam ambient for 25 min to convert the polysilazane film 70 into the silicon oxide ($SiO_2$) film 80. When 65 min have elapsed from the insertion of the semiconductor substrate 10, the supply of steam into the diffusion furnace is stopped, and evacuation is performed to once lower the pressure in the diffusion furnace to 0 Torr. After that, the pressure in the diffusion furnace is raised again and set at 760 Torr (atmospheric pressure), and the semiconductor substrate 10 is removed from the diffusion furnace.

In this embodiment as described above, the pressure in the diffusion furnace is lowered to allow impurities such as carbon (C) and nitrogen (N) to readily diffuse outside from the polysilazane film 70, and then oxidation is performed while the pressure in the diffusion furnace is raised by supplying steam. In this way, while the impurities such as carbon (C) and nitrogen (N) contained in the polysilazane film 70 are removed, Si—N bonds in the polysilazane film 70 are converted into Si—O bonds, thereby converting the polysilazane film 70 into the silicon oxide ($SiO_2$) film 80. Note that a reaction formula when the polysilazane film 70 is converted into the silicon oxide ($SiO_2$) film 80 is Formula 1  $SiH_2NH + 2O \rightarrow SiO_2 + NH_3$  (1)

Since the impurities such as carbon (C) and nitrogen (N) contained in the polysilazane film 70 are removed, the silicon oxide ($SiO_2$) film 80, obtained from the polysilazane film 70 is densified.

Figure 5:
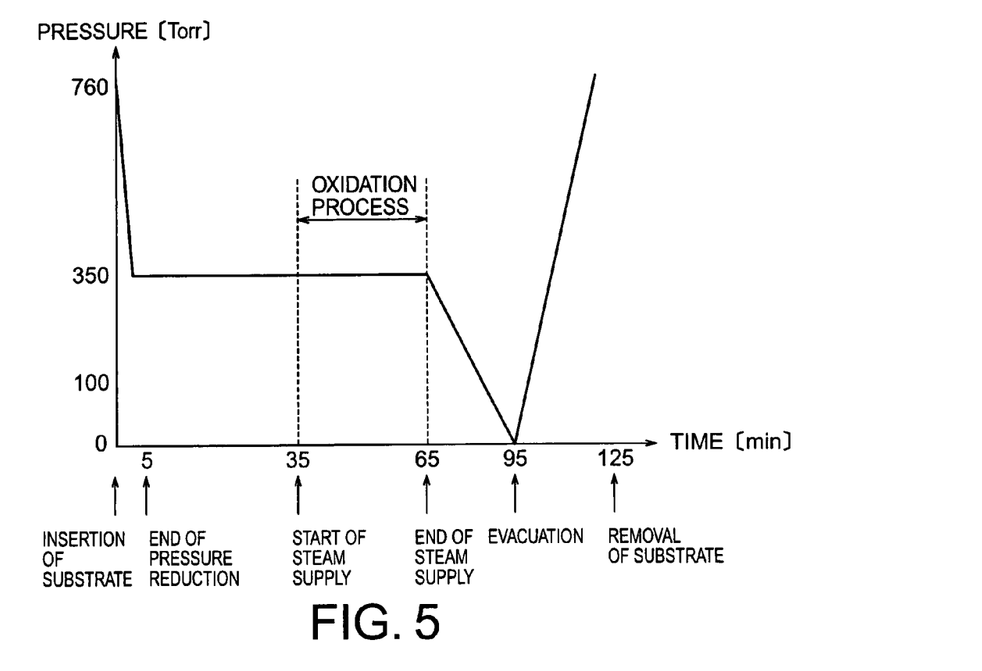
FIG. 5 is a graph showing a change in pressure in a diffusion furnace when an oxidation process of a comparative example is performed.

As a comparative example, FIG. 5 shows a change in pressure in the diffusion furnace when the semiconductor substrate 10 is inserted into the diffusion furnace, the pressure in the diffusion furnace is lowered to 350 Torr, and oxidation is performed while the pressure in the diffusion furnace is kept unchanged and maintained at 350 Torr from the start timing of supply of steam into the diffusion furnace to the end timing of the supply of steam.

Figure 6:
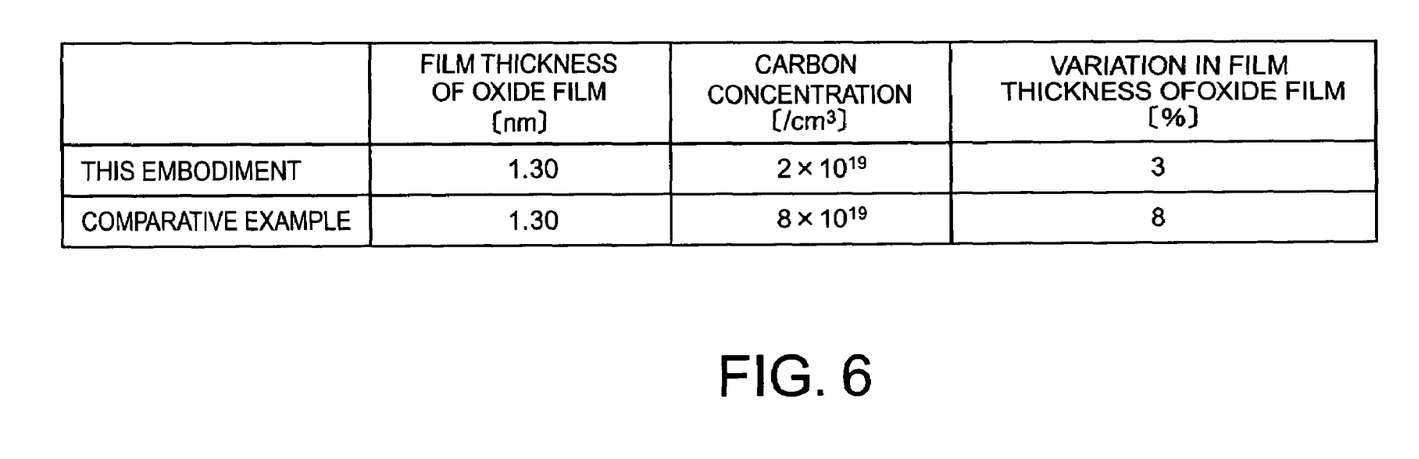
FIG. 6 is a view showing the results of comparison when the oxidation processes of the embodiment and comparative example are performed.

Note that a test substrate as a semiconductor substrate for checking the oxidation amount is set in the diffusion furnace. As shown in FIG. 6, in both the oxidation processes performed by the comparative example and this embodiment, the average value of the film thicknesses of silicon oxide ($SiO_2$) films formed on the test substrate is about 1.3 nm. That is, the oxidation amounts of these oxidation processes are substantially the same.

On the other hand, the concentration of carbon (C) in the silicon oxide ($SiO_2$) film 80 is $8 \times 10^{19}/cm^3$ in the comparative example and $2 \times 10^{19}/cm^3$ in this embodiment. That is, the oxidation process by this embodiment can greatly reduce the concentration of carbon (C) in the silicon oxide ($SiO_2$) film 80, compared to the oxidation process by the comparative example.

In this embodiment as described above, the concentration of carbon (C) which functions as positive fixed electric charge can be made much lower than that in the comparative example without increasing the oxidation amount of the oxidation process by the comparative example, i.e., with substantially the same oxidation amount as in the comparative example. Accordingly, the electric characteristics and reliability of the transistor can be improved.

When the pressure in the diffusion furnace is low, the diffusion rate of steam supplied into the diffusion furnace increases, so the steam readily diffuses. When steam is supplied by lowering the pressure in the diffusion furnace as in this embodiment, therefore, the steam well diffuses not only in the peripheral portion of the semiconductor substrate 10 but also in its central portion.

For example, as shown in FIG. 6, the variation in film thickness of the silicon oxide ($SiO_2$) film formed on the test substrate is 8% in the oxidation process by the comparative example, and 3% in the oxidation process by this embodiment. When the oxidation process by this embodiment is used, therefore, the variation in film thickness of the silicon oxide ($SiO_2$) film can be reduced compared to the oxidation process by the comparative example. This makes it possible to improve the uniformity of the oxidation amount in the same semiconductor substrate.

Also, a plurality of semiconductor substrates are inserted into a batch type diffusion furnace. Since, therefore, the oxidation process by this embodiment allows easy diffusion of steam as described above, the variations in film thickness of silicon oxide ($SiO_2$) films formed on different semiconductor substrates can be made smaller than in the oxidation process by the comparative example. Accordingly, the uniformity of the oxidation amounts of different semiconductor substrates can be improved.

Then, the silicon oxide ($SiO_2$) film 80 is densified as it is heat-treated (annealed) in dry oxygen at a temperature of, e.g., 900° C. for 30 min.

As shown in FIG. 3, the silicon nitride (SiN) film 30 is used as a stopper to polish the silicon oxide ($SiO_2$) film 80 to planarize its surface by CMP, thereby exposing the silicon nitride (SiN) film 30. After the silicon nitride (SiN) film 30 is removed by using hot phosphoric acid obtained by heating phosphoric acid, predetermined steps are performed to form an element such as a transistor on an element formation region 10A of the semiconductor substrate 10.

Note that the first embodiment described above is merely an example, and does not limit the present invention. For example, filling need not be performed by using the silazane perhydride polymer solution alone, and it is also possible to perform filling by using high-density plasma CVD, and fill portions, which are not filled by high-density plasma CVD, with the silazane perhydride polymer solution.

(2) SECOND EMBODIMENT

FIGS. 7 to 10 show an element isolation insulating film formation method according to the second embodiment of the present invention. Note that this embodiment relates to the formation of an element isolation insulating film for separating memory cell transistors of a NAND flash memory. In this case, an element isolation insulating film is formed after a floating gate electrode is formed on a semiconductor substrate via a tunnel insulating film.

Figure 7:
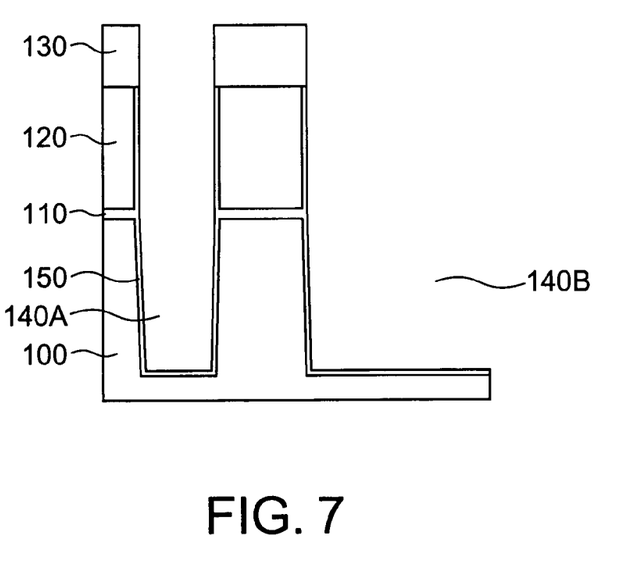
FIG. 7 is a longitudinal sectional view showing an element sectional structure in a predetermined step of a semiconductor device fabrication method according to the second embodiment of the present invention.

As shown in FIG. 7, a silicon oxide ($SiO_2$) film 110 serving as a tunnel oxide film is formed on a semiconductor substrate 100 by thermal oxidation. After that, a polysilicon film 120 serving as a floating gate electrode is formed by CVD, and a silicon nitride (SiN) film 130 serving as a stopper of polishing by CMP to be performed later is formed.

In the same manner as in the first embodiment, a hard mask is formed and used as a mask to sequentially pattern the silicon nitride (SiN) film 130, polysilicon film 120, and silicon oxide ($SiO_2$) film 110 by RIE. This hard mask is used as a mask again to etch the semiconductor substrate 100, thereby forming element isolation trenches 140A and 140B about 200 nm deep from the surface of the semiconductor substrate 100.

After the hard mask is removed by hydrofluoric acid steam (steam containing hydrofluoric acid), a silicon oxide ($SiO_2$) film 150 about 4 nm thick is formed on the inner surfaces of the element isolation trenches 140A and 140B by thermal oxidation.

Figure 8:
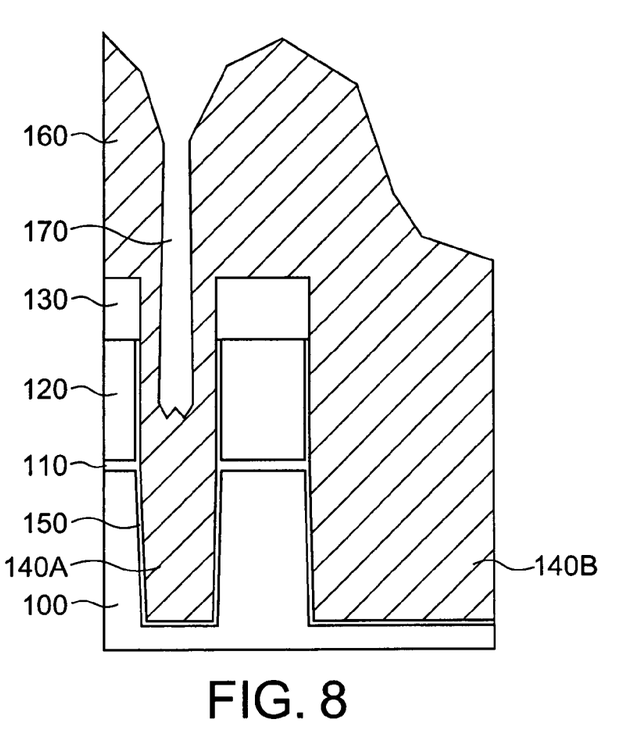
FIG. 8 is a longitudinal sectional view showing an element sectional structure in a predetermined step of the same semiconductor device fabrication method.

As shown in FIG. 8, high-density plasma CVD is used to form a silicon oxide ($SiO_2$) film 160 serving as an element isolation insulating film on the silicon oxide ($SiO_2$) film 150 and silicon nitride (SiN) film 130 so as to fill the element isolation trenches 140A and 140B.

The silicon oxide ($SiO_2$) film 160 completely fills the element isolation trench 140B having a low aspect ratio, but cannot completely fill the element isolation trench 140A having a high aspect ratio. Consequently, a slit-like gap 170 remains in the element isolation trench 140A. Note that the aspect ratio of the slit-like gap 170 is 10 or more, so it is difficult to fill the gap 170 by high-density plasma CVD.

Subsequently, as in the first embodiment, a silazane perhydride polymer solution is prepared by dispersing a silazane perhydride polymer $((SiH_2NH)_n)$ in a solvent such as xylene $(C_6H_4(CH_3)_2)$ or dibutylether $((C_4H_9)_2O)$.

Figure 9:
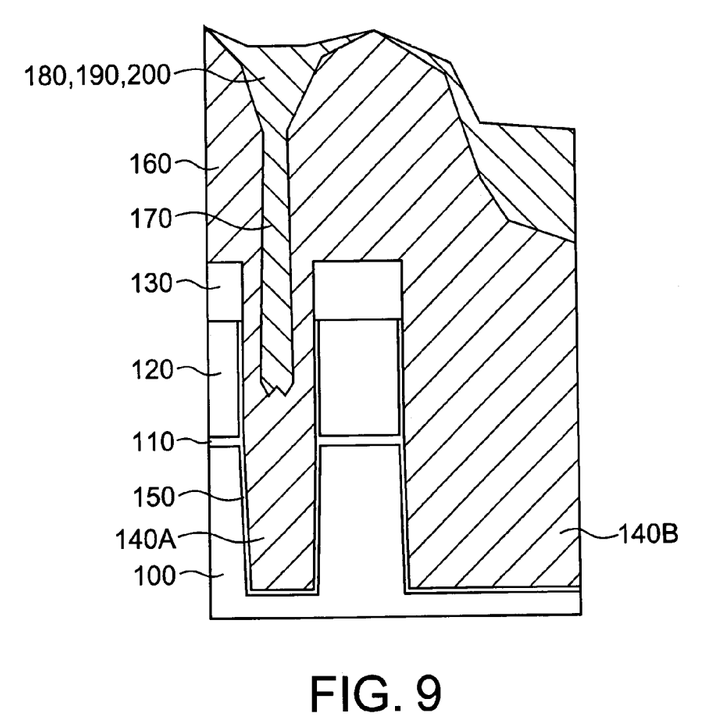
FIG. 9 is a longitudinal sectional view showing an element sectional structure in a predetermined step of the same semiconductor device fabrication method.

As shown in FIG. 9, while the semiconductor substrate 100 is rotated, the surface of the silicon oxide ($SiO_2$) film 160 is coated with the silazane perhydride polymer solution by spin coating so as to fill the gap 170 formed in the silicon oxide ($SiO_2$) film 160, thereby forming a coating film 180.

As described above, even when the aspect ratio of the gap 170 formed in the silicon oxide ($SiO_2$) film 160 is high, the gap 170 can be filled by coating of the silazane perhydride polymer solution as a liquid, without forming any voids (unfilled portions) or seams (seamed unfilled portions). Note that the spin coating conditions are the same as in the first embodiment.

Following the same procedure as in the first embodiment, a predetermined heat treatment is performed on the coating film 180 to volatilize the solvent such as xylene $(C_6H_4(CH_3)_2)$ or dibutylether $((C_4H_9)_2O)$ in the silazane perhydride polymer solution, thereby forming a polysilazane film 190. In this case, a few % to ten-odd % of carbon (C) or hydrocarbon contained in the solvent remains as an impurity.

The semiconductor substrate 100 having the polysilazane film 190 is inserted into a batch type diffusion furnace (not shown). In this diffusion furnace, the polysilazane film 190 is oxidized in the same manner as in the first embodiment, thereby forming a silicon oxide ($SiO_2$) film 200 serving as an element isolation insulating film together with the silicon oxide ($SiO_2$) film 160.

That is, the oxidation process is performed while the pressure in the diffusion furnace is raised by supplying steam into it. After the pressure in the diffusion furnace has risen to a predetermined pressure, the oxidation process is further performed for a predetermined time while this pressure is held, thereby converting the polysilazane film 190 into the silicon oxide ($SiO_2$) film 200. The various conditions of the oxidation process are the same as in the first embodiment.

In this manner, the polysilazane film 190 is converted into the silicon oxide ($SiO_2$) film 200 while impurities such as carbon (C) and nitrogen (N) contained in the polysilazane film 190 are removed.

In this case, as in the first embodiment, the silicon oxide ($SiO_2$) film 200 obtained from the polysilazane film 190 is densified because impurities such as carbon (C) and nitrogen (N) contained in the polysilazane film 190 are removed.

In this embodiment as described above, the concentration of carbon (C) which functions as positive fixed electric charge can be made much lower than that in a comparative example in which oxidation is performed with the pressure in the diffusion furnace held constant, without increasing the oxidation amount of the oxidation process by the comparative example, i.e., with substantially the same oxidation amount as in the comparative example. Accordingly, the electric characteristics and reliability of the transistor can be improved.

Note that the oxidation amount need not be increased in this embodiment. This makes it possible to prevent a so-called bird's beak by which the film thickness of the edge of the silicon oxide ($SiO_2$) film 110 serving as a tunnel insulating film increases. It is also possible to prevent deterioration of the silicon oxide ($SiO_2$) film 110 caused by the heat treatment.

Furthermore, as in the first embodiment, it is possible to improve the uniformity of the oxidation amount in the same semiconductor substrate, and improve the uniformity of the oxidation amounts in different semiconductor substrates.

Then, as in the first embodiment, the silicon oxide ($SiO_2$) film 200 is densified by a predetermined heat treatment (annealing).

Figure 10:
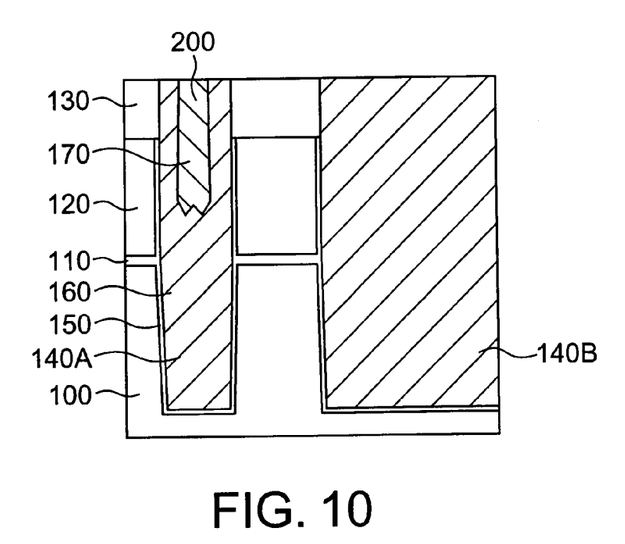
FIG. 10 is a longitudinal sectional view showing an element sectional structure in a predetermined step of the same semiconductor device fabrication method.

As shown in FIG. 10, the silicon nitride (SiN) film 130 is used as a stopper to polish the silicon oxide ($SiO_2$) films 160 and 200 to planarize their surfaces by CMP, thereby exposing the silicon nitride (SiN) film 130. After that, the silicon nitride (SiN) film 130 is removed by using hot phosphoric acid.

Finally, predetermined steps such as a step of forming a control gate electrode (not shown) on the polysilicon film 120 as a floating gate electrode via an insulating film are performed, thereby fabricating a memory cell transistor of a NAND flash memory.

Note that the second embodiment described above is merely an example, and does not limit the present invention. For example, although the silicon oxide ($SiO_2$) film 160 is formed by high-density plasma CVD, an HTO (High Temperature Oxide) film may also be formed by thermal CVD. In addition, after filling is performed by using high-density plasma CVD, the gap 170 which cannot be filled by high-density plasma CVD is filled with the silazane perhydride polymer solution. However, filling may also be performed by using the silazane perhydride polymer solution alone.

(3) ANOTHER EMBODIMENT

Figure 11:
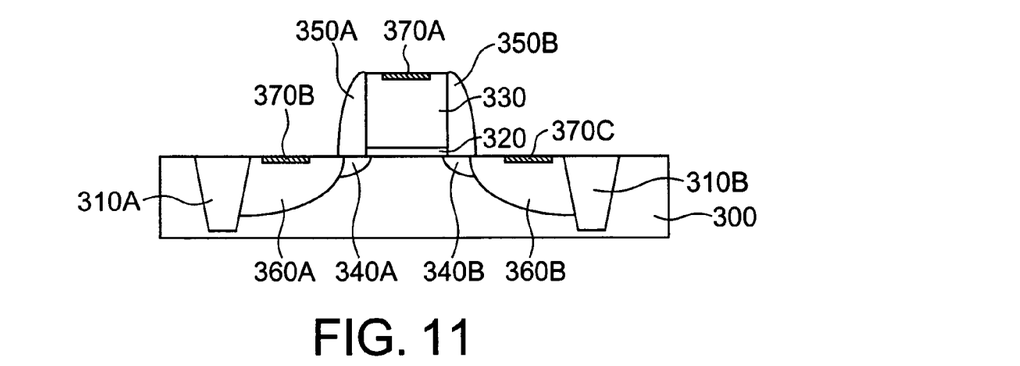
FIG. 11 is a longitudinal sectional view showing an element sectional structure in a predetermined step of a semiconductor device fabrication method according to another embodiment of the present invention.
Figure 12:
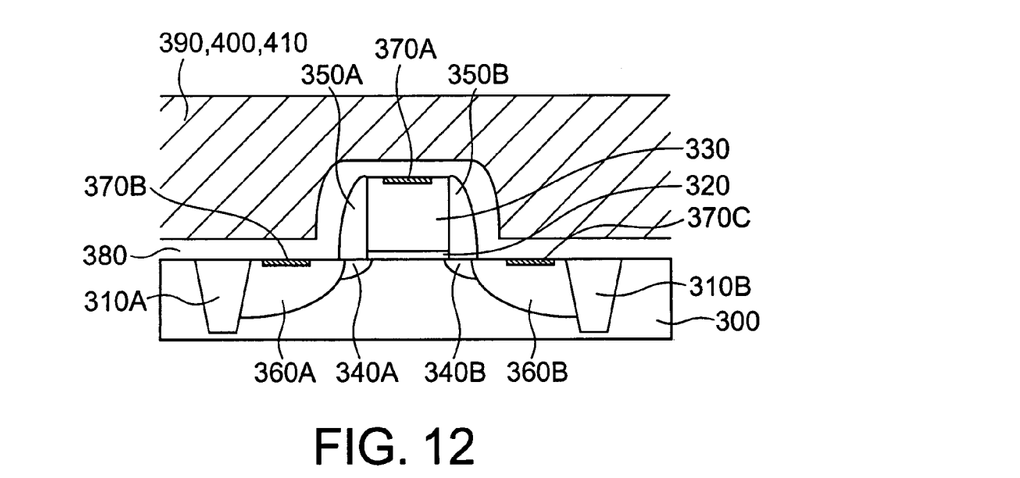
FIG. 12 is a longitudinal sectional view showing an element sectional structure in a predetermined step of the same semiconductor device fabrication method.
Figure 13:
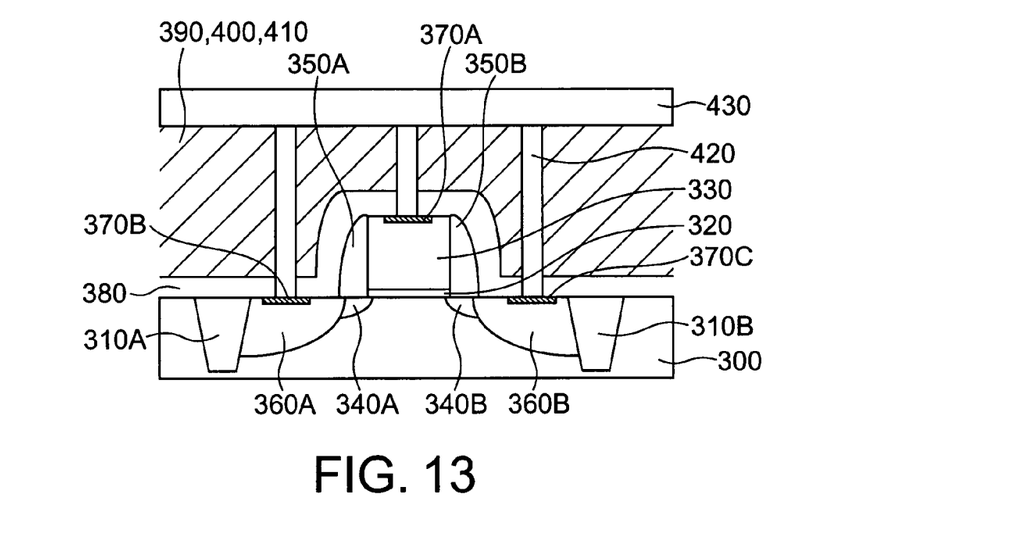
FIG. 13 is a longitudinal sectional view showing an element sectional structure in a predetermined step of the same semiconductor device fabrication method.

The above embodiments are merely examples, and do not limit the present invention. For example, the oxidation processes of the first and second embodiments may also be applied to the formation of not an element isolation insulating film but an interlayer dielectric film. FIGS. 11 to 13 show an interlayer dielectric film formation method according to another embodiment of the present invention.

As shown in FIG. 11, element isolation insulating films 310A and 310B are formed on a semiconductor substrate 300, and a gate insulating film 320 and gate electrode 330 are formed. Then, a source extension region 340A, a drain extension region 340B, gate electrode side walls 350A and 350B, a source region 360A, and a drain region 360B are sequentially formed.

After that, a metal film of, e.g., nickel (Ni), cobalt (Co), or lead (Pb) is formed by sputtering, and annealing is performed to form silicide films 370A to 370C for reducing the parasitic resistance in the surface portions of the gate electrode 330, source region 360A, and drain region 360B.

As shown in FIG. 12, a silicon nitride (SiN) film 380 serving as an etching stopper when contact holes are formed later is formed.

Subsequently, as in the first embodiment, a silazane perhydride polymer solution is prepared by dispersing a silazane perhydride polymer $((SiH_2NH)_n)$ in a solvent such as xylene $(C_6H_4(CH_3)_2)$ or dibutylether $((C_4H_9)_2O)$.

While the semiconductor substrate 300 is rotated, the surface of the silicon nitride (SiN) film 380 is coated with the silazane perhydride polymer solution by spin coating, thereby forming a coating film 390. Note that the spin coating conditions are the same as in the first embodiment.

Following the same procedure as in the first embodiment, a predetermined heat treatment is performed on the coating film 390 to volatilize the solvent such as a xylene $(C_6H_4(CH_3)_2)$ or dibutylether $((C_4H_9)_2O)$ in the silazane perhydride polymer solution, thereby forming a polysilazane film 400. In this case, a few % to ten-odd % of carbon (C) or hydrocarbon contained in the solvent remains as an impurity in the polysilazane film 400.

The semiconductor substrate 300 having the polysilazane film 400 is inserted into a batch type diffusion furnace (not shown). In this diffusion furnace, the polysilazane film 400 is oxidized in the same manner as in the first embodiment, thereby forming a silicon oxide $(SiO_2)$ film 410 serving as an interlayer dielectric film.

That is, the oxidation process is performed while the pressure in the diffusion furnace is raised by supplying steam into it. After the pressure in the diffusion furnace has risen to a predetermined pressure, the oxidation process is further performed for a predetermined time while this pressure is held, thereby converting the polysilazane film 400 into the silicon oxide $(SiO_2)$ film 410. The various conditions of the oxidation process are the same as in the first embodiment except that the temperature in the diffusion furnace is adjusted to fall within the range of 200° C. to 500° C.

In this manner, the polysilazane film 400 is converted into the silicon oxide $(SiO_2)$ film 410 while impurities such as carbon (C) and nitrogen (N) contained in the polysilazane film 400 are removed.

If the silicon oxide $(SiO_2)$ film 410 as an interlayer dielectric film is formed at a high temperature of, e.g., 500° C. or more, the silicide films 370A to 370C aggregate, and this increases the resistance of these films. Therefore, an interlayer dielectric film must be formed at a low temperature. For example, when the silicide films 370A to 370C are made of nickel silicide, an interlayer dielectric film must be formed at a temperature of 500° C. or less.

If, for example, high-density plasma CVD is used, an interlayer dielectric film can be formed at a low temperature. However, if an interlayer dielectric film is thus formed by high-density plasma CVD, so-called plasma damage is inflicted on the silicon nitride (SiN) film 380 serving as an etching stopper, and the film quality of the silicon nitride (SiN) film 380 deteriorates.

By contrast, in this embodiment, an interlayer dielectric film can be formed at a low temperature, and this prevents the increase in resistance of the silicide films 370A to 370C. Also, unlike in high-density plasma CVD, no plasma damage is inflicted on the silicon nitride (SiN) film 380 serving as an etching stopper. This prevents deterioration of the film quality of the silicon nitride (SiN) film 380.

As shown in FIG. 13, contact holes (not shown) are formed by etching the silicon oxide $(SiO_2)$ film 410 by using the silicon nitride (SiN) film 380 as an etching stopper. After that, portions of the upper surfaces of the silicide films 370A to 370C are exposed by forming holes in the silicon nitride (SiN) film 380 by etching.

Contact plugs 420 are formed by burying tungsten or the like in these contact holes. After that, an interconnection 430 made of, e.g., aluminum is formed on the silicon oxide $(SiO_2)$ film 410 and contact plugs 420.

The semiconductor device fabrication method of the above embodiment can prevent deterioration of the electrical characteristics and reliability of the transistor.

What is claimed is:

1. A semiconductor device fabrication method comprising:
   forming a coating film over a semiconductor substrate with a silazane perhydride polymer solution prepared by dispersing a silazane perhydride polymer in a solvent containing carbon;
   forming a polysilazane film by volatilizing the solvent by heat treating the coating film;
   inserting the semiconductor substrate into a predetermined furnace, and lowering a pressure in the furnace to a predetermined first value; and
   oxidizing the polysilazane film in steam atmosphere while raising the pressure in the furnace to a predetermined second value, thereby forming a silicon oxide film.

2. A method according to claim 1, wherein after the pressure in the furnace is raised to the second value, oxidation is further performed for a predetermined time while the pressure is held at the second value.

3. A semiconductor device fabricating method comprising:
   forming a first film over a semiconductor substrate with a predetermined solution prepared by dispersing a material containing silicon in a solvent containing carbon;
   forming a second film by volatilizing the solvent by heat treating the first film;
   inserting the semiconductor substrate into a predetermined furnace, and lowering a pressure in the furnace to a predetermined first value; and
   oxidizing the second film in steam atmosphere while raising the pressure in the furnace to a predetermined second value, thereby forming a silicon oxide film.

4. A method according to claim 3, wherein after the pressure in the furnace is raised to the second value, oxidation is further performed for a predetermined time while the pressure is held at the second value.

5. A method according to claim 3, further comprising:
forming a semiconductor element including a gate electrode above the semiconductor substrate, wherein when the first film is formed over the gate electrode, the first film serves as an interlayer dielectric film.

6. A method according to claim 5, further comprising:
forming a source region and a drain region in surface portions of the semiconductor substrate; and
forming silicide films on surface portions of the source region and the drain region, or on a surface portion of the gate electrode.

7. A semiconductor device fabricating method comprising:
forming a first film over a semiconductor substrate with a predetermined solution prepared by dispersing a material containing silicon in a solvent containing carbon;
forming a second film by volatilizing the solvent by heat treating the first film; and
oxidizing the second film in steam atmosphere of a predetermined furnace while a pressure in the furnace is raised, thereby forming a silicon oxide film.

8. A method according to claim 7, wherein after the pressure in the furnace is raised to the second value, oxidation is further performed for a predetermined time while the pressure is held at the second value.

9. A method according to claim 7, further comprising:
forming a semiconductor element including a gate electrode above the semiconductor substrate, wherein when the first film is formed over the gate electrode, the first film serves as an interlayer dielectric film.

10. A method according to claim 9, further comprising:
forming a source region and a drain region in surface portions of the semiconductor substrate; and
forming silicide films on surface portions of the source region and the drain region, or on a surface portion of the gate electrode.

* * * * *